US011991854B2

(12) United States Patent
Wu et al.

(10) Patent No.: US 11,991,854 B2
(45) Date of Patent: May 21, 2024

(54) WIRELESS CHARGING BASE

(71) Applicant: Huawei Digital Power Technologies Co., Ltd., Shenzhen (CN)

(72) Inventors: Hao Wu, Xi'an (CN); Jun Chen, Dongguan (CN); Yongwang Xiao, Shanghai (CN); Jun Li, Shenzhen (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 154 days.

(21) Appl. No.: 17/704,996

(22) Filed: Mar. 25, 2022

(65) Prior Publication Data

US 2022/0217866 A1 Jul. 7, 2022

Related U.S. Application Data

(63) Continuation of application No. PCT/CN2020/094216, filed on Jun. 3, 2020.

(30) Foreign Application Priority Data

Nov. 5, 2019 (CN) .......................... 201921891897.6

(51) Int. Cl.
*H05K 7/20* (2006.01)
*H02J 7/00* (2006.01)
(Continued)

(52) U.S. Cl.
CPC ........ *H05K 7/20145* (2013.01); *H02J 7/0044* (2013.01); *H02J 50/00* (2016.02); *H05K 7/20172* (2013.01); *G06F 1/1632* (2013.01)

(58) Field of Classification Search
CPC ........ H02J 50/10; H02J 7/0044; H02J 7/0042; H05K 7/20136; H05K 7/20145;
(Continued)

(56) References Cited

U.S. PATENT DOCUMENTS 10,785,887 B2 * 9/2020 Jeong .................... H02J 7/0013
10,793,084 B2 * 10/2020 Jiang .................... H04B 1/3877
(Continued)

FOREIGN PATENT DOCUMENTS

CN 207725322 U 8/2018
CN 207765996 U 8/2018
(Continued)

*Primary Examiner* — Robert J Hoffberg
(74) *Attorney, Agent, or Firm* — Leydig, Voit & Mayer, Ltd.

(57) ABSTRACT

A wireless charging base is provided, and is mainly applied to electronic devices such as a mobile phone and a tablet computer. The wireless charging base includes a charging panel, configured to charge the electronic device. The charging panel includes a first air vent and a second air vent. A first base plate is disposed on an upper surface of the charging panel, is located at an end of the charging panel, and is configured to support the electronic device when the electronic device is being charged. The first base plate includes a third air vent. A second base plate is disposed on the lower surface of the charging panel, is located at the same end as the first base plate, and is configured to support the charging panel. The second base plate includes a fourth air vent.

7 Claims, 6 Drawing Sheets

(51) Int. Cl.
*H02J 50/00* (2016.01)
*G06F 1/16* (2006.01)

(58) Field of Classification Search
CPC .. H01F 27/025; H01F 27/085; H01F 27/2876; G06F 1/1632
See application file for complete search history.

(56) References Cited

U.S. PATENT DOCUMENTS

| | | | | |
|---|---|---|---|---|
| 11,329,506 B2* | 5/2022 | Morrow | | H02J 7/0044 |
| 11,503,745 B2* | 11/2022 | Moon | | H02J 50/10 |
| 11,735,936 B2* | 8/2023 | Moon | | H02J 7/02 |
| | | | | 320/108 |
| 2019/0014683 A1 | 1/2019 | Han | | |
| 2019/0115781 A1* | 4/2019 | Feng | | H02J 7/0044 |
| 2020/0091755 A1* | 3/2020 | Larsson | | H02J 7/0044 |
| 2022/0256732 A1* | 8/2022 | Wu | | H05K 7/20145 |
| 2023/0014262 A1* | 1/2023 | Wu | | H02J 50/10 |

FOREIGN PATENT DOCUMENTS

| | | | | |
|---|---|---|---|---|
| CN | 207766038 U | | 8/2018 | |
| CN | 109586377 A | * | 4/2019 | ............ H02J 7/0044 |
| CN | 209233498 U | | 8/2019 | |
| CN | 209375207 U | | 9/2019 | |
| CN | 113852144 A | * | 12/2021 | |
| CN | 215071741 U | * | 12/2021 | |
| EP | 3340420 A1 | | 6/2018 | |
| EP | 3490101 A1 | | 5/2019 | |
| EP | 4224666 A1 | * | 8/2023 | ......... H05K 7/20145 |
| KR | 102302100 B1 | * | 9/2021 | ............. B60R 11/00 |
| WO | 2019121530 A1 | | 6/2019 | |
| WO | WO-2019114253 A1 | * | 6/2019 | |

* cited by examiner

WIRELESS CHARGING BASE

CROSS-REFERENCE TO RELATED APPLICATIONS

This application is a continuation of International Application No. PCT/CN 2020/094216, filed on Jun. 3, 2020, which claims priority to Chinese Patent Application No. 201921891897.6, filed on Nov. 5, 2019. The disclosures of the aforementioned applications are hereby incorporated by reference in their entireties.

TECHNICAL FIELD

Embodiments of this application relate to the field of wireless charging technologies, and in particular, to a wireless charging base.

BACKGROUND

With advances in science and technology, an increasing quantity of electronic devices currently support wireless charging. However, a heat dissipation capability of a wireless charger directly affects charging power and a charging speed. In existing wireless charging, heat of the wireless charger is usually dissipated naturally or by using one fan. In a charging process, heat of the electronic device is mainly dissipated naturally. Because the natural heat dissipation is relatively slow and greatly limits the charging speed, a manner of active heat dissipation needs to be added to the electronic device to improve wireless charging performance.

SUMMARY

To overcome the foregoing problem, embodiments of this application provide a wireless charging base.

To achieve the foregoing objectives, the following technical solutions are used in the embodiments of this application.

According to a first aspect, this application provides a wireless charging base, including a charging panel, a first base plate, and a second base plate.

The charging panel is configured to charge an electronic device, and the charging panel includes a first air vent and a second air vent.

The first air vent is disposed on a lower surface of the charging panel, and the lower surface is a surface opposite to a surface that is in contact with the charging panel when the electronic device is being charged.

The second air vent is disposed on a side surface around the charging panel. An air duct exists between the first air vent and the second air vent.

The first base plate is disposed on an upper surface of the charging panel, is located at an end of the charging panel, and is configured to support the electronic device when the electronic device is being charged. The upper surface is the surface that is in contact with the charging panel when the electronic device is being charged, and the first base plate includes a third air vent.

The third air vent is disposed on a first surface of the first base plate, and the first surface of the first base plate is a surface that is of the first base plate and that is close to the second air vent.

The second base plate is disposed on the lower surface of the charging panel, is located at the same end as the first base plate, and is configured to support the charging panel, and the second base plate includes a fourth air vent.

The fourth air vent is disposed on a first surface of the second base plate, and the first surface of the second base plate is a surface that is of the second base plate and that is close to the charging panel. An air duct exists between the third air vent and the fourth air vent.

According to the wireless charging base provided in this embodiment of this application, two air vents are disposed on the charging panel, so that an air flow flows through an air duct between the two air vents, to cool a circuit inside the charging panel. Two air vents are separately disposed on the two base plates, so that an air flow flows through an air duct between the two air vents, to cool the electronic device that is being charged.

In another possible implementation, the wireless charging base further includes at least one first fan and at least one second fan.

The at least one first fan is disposed inside the charging panel, and is configured to suck air into the inside of the charging panel from one of the first air vent and the second air vent, and a formed air flow flows out from the other air vent in the first air vent and the second air vent. The at least one second fan is disposed inside the second base plate, and is configured to suck air into the inside of the first base plate and the second base plate from one of the third air vent and the fourth air vent, and a formed air flow flows out from the other air vent in the third air vent and the fourth air vent.

In this application, fans are disposed inside the charging panel and the base plate, so that air flows are formed in an air duct between two air vents on the charging panel and an air duct between two air vents on the two base plates, and flow in the air ducts.

In another possible implementation, the wireless charging base further includes a first clamp and a second clamp.

The first clamp and the second clamp are disposed on side edges around the charging panel, the charging panel is located between the first clamp and the second clamp, and the first clamp and the second clamp are configured to fasten the electronic device to the charging panel when the electronic device is being charged.

The two clamps provided in this embodiment of this application fasten the electronic device to the charging panel and prevent the electronic device from falling down when the electronic device rests on the charging panel and is being charged.

In another possible implementation, the wireless charging base includes a fifth air vent and a sixth air vent.

The fifth air vent is disposed on a surface that is of the first clamp and that is opposite to the second clamp.

The sixth air vent is disposed on a surface that is of the second clamp and that is opposite to the first clamp.

Air ducts exist between each of the fifth air vent and the sixth air vent and both the first air vent and the second air vent.

In this embodiment of this application, an air vent is disposed on the clamp, an air duct is formed between the air vent and another air vent, and when an air flow flows through the air duct between the two air vents, the electronic device that is being charged is cooled.

In another possible implementation, at least two protrusions are disposed on each of opposite surfaces of the first clamp and the second clamp, and are configured to form air ducts between the electronic device and the opposite surfaces of the first clamp and the second clamp when the electronic device is being charged.

In this embodiment of this application, protrusions are disposed on the opposite surfaces of the clamps, to prevent the clamps from blocking air vents on the surfaces when the electronic device is fastened, and to form air ducts between the clamps and the electronic device. When air flows flow through the air ducts, the electronic device that is being charged is cooled.

In another possible implementation, the charging panel further includes a seventh air vent.

The seventh air vent is disposed on the upper surface of the charging panel, where air ducts exist between the seventh air vent and the first air vent and between the seventh air vent and the second air vent.

In this embodiment of this application, an air vent is disposed on the surface that is of the charging panel and that is in contact with the electronic device that is being charged, an air duct is formed between the air vent and another air vent, and when an air flow flows through the air duct, the electronic device that is being charged is cooled.

In another possible implementation, at least two protrusions are disposed on the upper surface of the charging panel, and are configured to form an air duct between the electronic device and the upper surface of the charging panel when the electronic device is being charged.

In this embodiment of this application, the protrusions are disposed on the surface that is of the charging panel and that is in contact with the electronic device that is being charged, to prevent the electronic device from resting on the charging panel and blocking an air vent on the surface, and to form an air duct between the charging panel and the electronic device. When an air flow flows through the air duct, the electronic device that is being charged is cooled.

In another possible implementation, at least two protrusions are disposed on the first surface of the first base plate, and are configured to form an air duct between the electronic device and the first surface of the first base plate when the electronic device is being charged In this embodiment of this application, protrusions are disposed on a side surface of a side that is of the first base plate and that is close to the second air vent, to prevent the electronic device from being placed on the first base plate and the charging panel and blocking an air vent on the surface, and to form an air duct between the first base plate and the electronic device. When an air flow flows through the air duct, the electronic device that is being charged is cooled.

In another possible implementation, an included angle between the first base plate and the charging panel is 90 degrees.

According to a second aspect, an embodiment of this application further provides a wireless charging base, including a charging panel and a first base plate.

The charging panel is configured to charge an electronic device, and the charging panel includes a first air vent.

The first air vent is disposed on a side surface around the charging panel.

The first base plate is disposed on a side surface around the charging panel, and is configured to support the electronic device when the electronic device is being charged, and the first base plate includes a second air vent.

The second air vent is disposed on a first surface of the first base plate, and the first surface is a surface that is of the first base plate and that is close to the charging panel. An air duct exists between the first air vent and the second air vent.

According to the wireless charging base provided in this embodiment of this application, an air vent is disposed on each of the charging panel and the base plate, so that an air flow flows through an air duct between the two air vents, to cool a circuit inside the charging panel and the electronic device that is being charged.

In another possible implementation, the wireless charging base further includes at least one fan.

The at least one fan is disposed inside the charging panel, and is configured to suck air into the inside of the charging panel from one of the first air vent and the second air vent. A formed air flow flows out from the other air vent in the first air vent and the second air vent.

In this application, a fan is disposed inside the charging panel, so that an air flow is formed in an air duct between two air vents on the charging panel, and flows in the air duct.

In another possible implementation, the wireless charging base further includes a first clamp and a second clamp.

The first clamp and the second clamp are disposed on side surfaces around the charging panel, the charging panel is located between the first clamp and the second clamp, and the first clamp and the second clamp are configured to fasten the electronic device to the charging panel when the electronic device is being charged.

The two clamps provided in this embodiment of this application fasten the electronic device to the charging panel and prevent the electronic device from falling down when the electronic device rests on the charging panel and is being charged.

In another possible implementation, the wireless charging base further includes a third air vent and a fourth air vent.

The third air vent is disposed on a surface that is of the first clamp and that is opposite to the second clamp.

The fourth air vent is disposed on a surface that is of the second clamp and that is opposite to the first clamp. Air ducts exist between each of the third air vent and the fourth air vent and both the first air vent and the second air vent In this embodiment of this application, an air vent is disposed on the clamp, an air duct is formed between the air vent and another air vent, and when an air flow flows through the air duct between the two air vents, the electronic device that is being charged is cooled.

In another possible implementation, at least two protrusions are disposed on each of opposite surfaces of the first clamp and the second clamp, and are configured to form air ducts between the electronic device and the opposite surfaces of the first clamp and the second clamp when the electronic device is being charged.

In this embodiment of this application, protrusions are disposed on the opposite surfaces of the clamps, to prevent the clamps from blocking air vents on the surfaces when the electronic device is fastened, and to form air ducts between the clamps and the electronic device. When air flows flow through the air ducts, the electronic device that is being charged is cooled.

In another possible implementation, the charging panel further includes a fifth air vent.

The fifth air vent is disposed on an upper surface of the charging panel, and the upper surface is a surface that is in contact with the charging panel when the electronic device is being charged, where air ducts exist between the fifth air vent and the first air vent and between the fifth air vent and the second air vent.

In this embodiment of this application, an air vent is disposed on the surface that is of the charging panel and that is in contact with the electronic device that is being charged, an air duct is formed between the air vent and another air vent, and when an air flow flows through the air duct, the electronic device that is being charged is cooled.

In another possible implementation, at least two protrusions are disposed on the upper surface of the charging panel, and are configured to form an air duct between the electronic device and the upper surface of the charging panel when the electronic device is being charged.

In this embodiment of this application, the protrusions are disposed on the surface that is of the charging panel and that is in contact with the electronic device that is being charged, to prevent the electronic device from resting on the charging panel and blocking an air vent on the surface, and to form an air duct between the charging panel and the electronic device. When an air flow flows through the air duct, the electronic device that is being charged is cooled.

In another possible implementation, at least two protrusions are disposed on the first surface of the first base plate, and are configured to form an air duct between the electronic device and the first surface of the first base plate when the electronic device is being charged In this embodiment of this application, protrusions are disposed on a side surface of a side that is of the first base plate and that is close to the charging panel, to prevent the electronic device from being placed on the first base plate and the charging panel and blocking an air vent on the surface, and to form an air duct between the first base plate and the electronic device. When an air flow flows through the air duct, the electronic device that is being charged is cooled.

BRIEF DESCRIPTION OF DRAWINGS

The following briefly describes the accompanying drawings used in describing the embodiments or the conventional technology.

DESCRIPTION OF EMBODIMENTS

The following describes the technical solutions in the embodiments of this application with reference to the accompanying drawings in the embodiments of this application.

In descriptions of this application, locations or location relationships indicated by terms "center", "up", "down", "in front of", "behind", "left", "right", "vertical", "horizontal", "top", "bottom", "inside", "outside", and the like are based on locations or location relationships shown in the accompanying drawings, and are merely intended for ease of describing this application and simplifying descriptions, instead of indicating or implying that a mentioned apparatus or component needs to be provided on a specific location or constructed and operated on a specific location, and therefore shall not be understood as limitations on this application.

In the descriptions of this application, it should be noted that, unless otherwise clearly specified and limited, terms "mount", "link", and "connect" should be understood in a broad sense, for example, may mean a fixed connection, may be a detachable connection, or may be a butt joint connection or an integrated connection. Persons of ordinary skill in the art can understand specific meanings of the foregoing terms in this application based on specific cases.

A wireless charging base provided in the embodiments of this application is configured to charge an electronic device. The electronic device may be a mobile phone, a tablet computer, a desktop computer, an ultra-mobile personal computer (UMPC), a handheld computer, a netbook, a personal digital assistant (PDA), a wearable electronic device, a virtual reality device, or the like. This is not limited in the embodiments of this application. The following uses an example in which the electronic device is a mobile phone.

Figure 1:
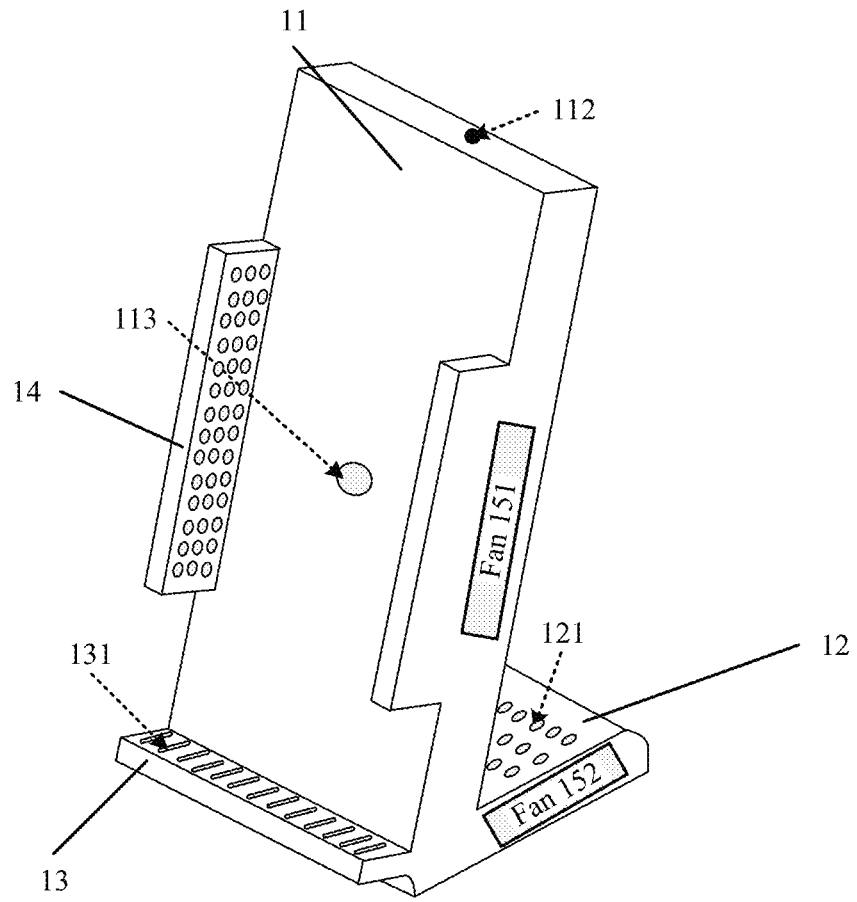
FIG. 1 is a schematic diagram of a front-view structure of a wireless charging base according to an embodiment of this application.
Figure 2:
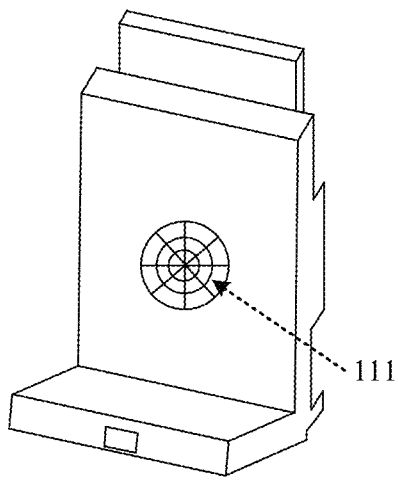
FIG. 2 is a schematic diagram of a rear-view structure of a wireless charging base according to an embodiment of this application.

FIG. 1 and FIG. 2 are schematic diagrams of structures of a wireless charging base according to an embodiment of this application.

As shown in the figure, the wireless charging base provided in this embodiment of this application includes a charging panel 11, a base plate 12, and a base plate 13.

A wireless charging circuit (not shown in the figure) is disposed inside the charging panel 11, and is configured to charge a mobile phone when the mobile phone is close to the charging panel 11. A shape of the charging panel 11 is not limited to a cuboid shown in FIG. 1 and FIG. 2, and may be various shapes such as a cylinder and a cube that are common in a current market.

In this embodiment of this application, a fan 151 is disposed inside the charging panel 11. The charging panel 11 includes at least two air vents. An air vent 111 is located on a surface (for ease of subsequent description, the surface is referred to as a "lower surface", and a surface that is in contact with the mobile phone when the charging panel performs charging is referred to as an "upper surface") that is of the charging panel 11 and that is opposite to the surface in contact with the mobile phone when the charging panel 11 performs charging, and an air vent 112 is located on a side surface around the charging panel 11.

When the fan 151 operates, one of the air vent 111 and the air vent 112 provides air for the fan 151 as an air intake vent, and the other air vent in the air vent 111 and the air vent 112 exhausts air for the fan 151 as an air exhaust vent. Because an internal temperature of the charging panel 11 becomes increasingly higher when the charging panel 11 charges the mobile phone, in this application, the fan 151 is disposed inside the charging panel 11, to cool the charging panel 11 when the charging panel 11 operates.

Preferably, in this embodiment of this application, the air vent 111 is used as an air intake vent, and the air vent 112 is used as an air exhaust vent. After air enters the fan 151 inside the charging panel 11 through the air vent 111, an air flow is formed and flows out from the air vent 112, as shown by directions of arrows shown in FIG. 3.

It should be specially noted that FIG. 2 shows the example in which the air vent 111 is used as an air intake vent and the air vent 112 is used as an air exhaust vent. As mentioned in this application, there is a wireless charging circuit in the charging panel 11, and the fan mainly cools the circuit. Therefore, the circuit may be disposed between the fan 151 and the air vent 112, so that a wind flow formed when the fan 151 operates passes through the circuit, to achieve a cooling effect.

In this embodiment of this application, a type, a model, and the like of the fan 151 are not limited. A size of the fan 151 needs to be small, so that the fan 151 is installed inside the charging panel 11, without increasing an overall volume of the wireless charging base. A quantity of fans 151 is not limited, either, and is selected as actually required.

In this embodiment of this application, the air vent 111 is most preferably located near the fan 151 on the lower surface of the charging panel 11, to better provide air or exhaust air for the fan 151. A shape of the air vent 111 may be a spiderweb-like shape shown in FIG. 2, or may be a matrix shape formed by a plurality of circular holes. This is not limited in this embodiment of this application.

In addition, a shape of the air vent 112 may be a circular hole that has a relatively large radius and that is shown in FIG. 1, or may be a spiderweb-like shape, a matrix shape formed by a plurality of circular holes, or the like. This is not limited in this embodiment of this application, either.

In a feasible embodiment, an air vent 113 is disposed on the upper surface of the charging panel 11. The air vent 113 is most preferably located near the fan 151 on the upper surface of the charging panel 11, so that an air flow blown out when the fan 151 operates better flows out from the air vent 113, as shown by directions of arrows shown in FIG. 3 and FIG. 4, to cool the mobile phone that is being charged. A shape of the air vent 113 may be a circular hole that has a relatively large radius and that is shown in FIG. 1, or may be a spiderweb-like shape, a matrix shape formed by a plurality of circular holes, or the like. This is not limited in this embodiment of this application, either.

In a feasible embodiment, at least two protrusions are disposed at a center position of the upper surface of the charging panel 11, and are configured to form an air duct between the mobile phone and the upper surface of the charging panel 11 when the mobile phone is close to the charging panel 11 and being charged, to avoid a temperature rise caused when the mobile phone and the upper surface of the charging panel 11 are closely attached, and make, when the air vent 113 is disposed on the upper surface of the charging panel 11, it convenient for an air flow to flow out from the air vent 113, to cool the mobile phone that is being charged. A shape formed by the plurality of protrusions is not limited to a circle shown in FIG. 1, and may be any pattern such as a rectangle or a star. This is not limited in this embodiment of this application, either.

The wireless charging base provided in this embodiment of this application further includes two clamps 14. The two clamps 14 are separately disposed on side surfaces around the charging panel 11, so that the charging panel 11 is located between the two clamps 14, and the two clamps 14 are configured to fasten the mobile phone on which wireless charging is being performed. In this embodiment of this application, air vents 141 are disposed on opposite surfaces of the two clamps 14, and the inside of the clamp 14 is disposed as a hollow structure or an air duct (not shown in the figure) is disposed inside the clamp 14. The hollow structure or the air duct is connected to the inside of the charging panel 11, so that after being directed to the hollow structure or the air duct, an air flow blown out by the fan 151 flows out through the air vent 141, as shown by the directions of the arrows shown in FIG. 3, to cool the mobile phone that is being charged.

A shape of the air vent 141 is not limited to a matrix shape formed by a plurality of circular holes shown in FIG. 1, and may be a matrix shape formed by a plurality of parallel rectangular holes, a matrix shape formed by a plurality of square holes, or the like. This is not limited in this embodiment of this application.

In a feasible embodiment, at least two protrusions are disposed on each of opposite surfaces of the two clamps 14, and are configured to form air ducts between the mobile phone and the opposite surfaces of the two clamps 14 when the mobile phone is fastened, to avoid a temperature rise caused when the mobile phone and the surface of the clamp 14 are closely attached, and make, when the air vents 141 are disposed on the opposite surfaces of the two clamps 14, it convenient for air flows to flow out from the air vents 141, to cool the mobile phone that is being charged.

In addition, a shape and a fastening manner of the clamp 14 in this embodiment of this application are not limited to those shown in FIG. 1, and may be another shape and fastening manner. In a feasible embodiment, as shown in FIG. 5(a) and FIG. 5(b), the clamp 14 includes a first structure (which is not shown in the figure, and is a part embedded into the inside of the charging panel 11 in FIG. 5(a)) and a second structure (which is not shown in the figure, and is a part that is outside the charging panel 11 and that is perpendicular to the charging panel 11 in FIG. 5(a)), and the first structure and the second structure are connected to each other and are perpendicular or approximately perpendicular to each other.

The first structure is embedded into the inside of the charging panel 11, and the second structure is located on two sides of the charging panel 11. An air vent 142 is disposed on a side surface at an end opposite to an end that is of the first structure and that is connected to the second structure. Air vents 141 are disposed on opposite surfaces of two second structures. The inside of the first structure and the second structure may be disposed as a hollow structure or an air duct (not shown in the figure) is disposed inside the first structure and the second structure, so that after being directed to the hollow structure or the air duct from the air vent 142, an air flow blown out by the fan 151 flows out through the air vent 141, to cool the mobile phone that is being charged.

Figure 5A:
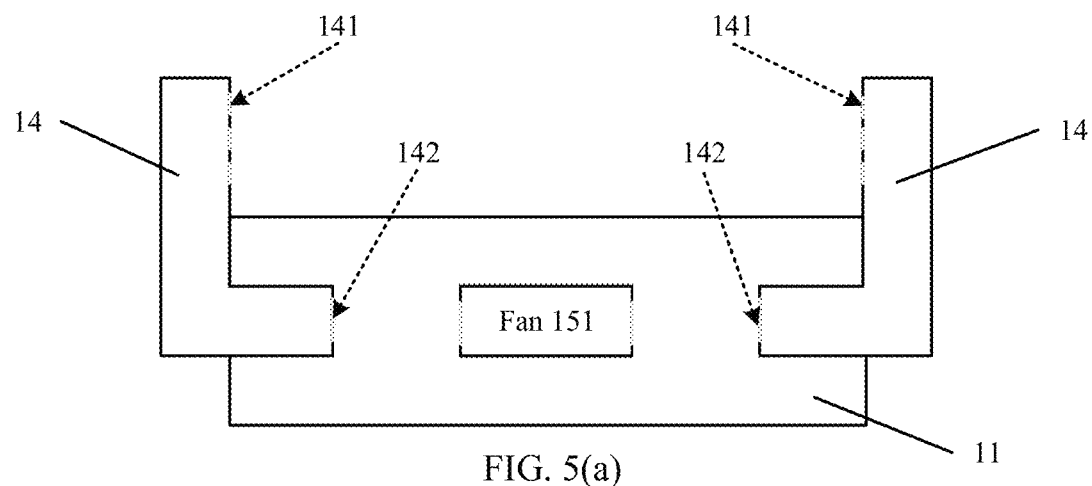
FIG. 5(a) and FIG. 5(b) are a schematic diagram of a structure of a clamp according to an embodiment of this application.
Figure 5B:
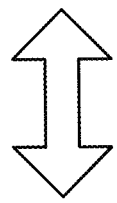
Figure 5B:
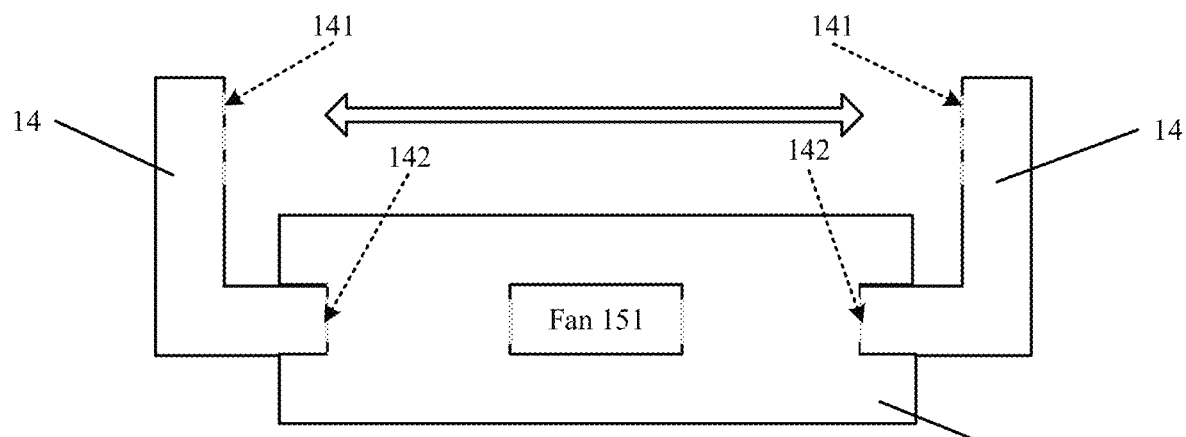

When a shape of an electronic device that needs to be charged is relatively large and exceeds a width of the charging panel 11, the clamps 14 on two sides of the charging panel 11 need to be pulled away from each other, so that first structures of the two clamps 14 are constantly withdrawn from the charging panel 11, and a distance between the two second structures is constantly increased from a state in FIG. 5(a) to a state in FIG. 5(b). When the distance between the two second structures reaches a width of the electronic device that needs to be charged, the electronic device is placed on the upper surface of the charging panel 11 and between the two second structures, so that the to-be-charged electronic device is fastened.

For a shape and a fastening manner of the clamp 14 designed in this way in this embodiment, a distance between the clamps 14 may be adjusted based on a shape and a size of an electronic device that needs to be charged, so that the wireless charging base provided in this embodiment of this application can charge electronic devices with different sizes and shapes.

Preferably, the air vent 141 is used as an air exhaust vent. After an air flow formed when air passes through the fan 151 flows out from the air vent 141, air flows are formed on an upper surface and a lower surface of the mobile phone that is being charged, to cool the mobile phone that is being charged.

It should be specially noted that the wireless charging base provided in this embodiment of this application may include no clamp 14. When the charging panel 11 is horizontally placed on a desktop or tilted on a desktop at a small angle, the mobile phone may be directly placed on the upper surface of the charging panel 11 without being fastened by using the clamp 14.

The base plate 13 is disposed on the upper surface of the charging panel 11, and is located at an end other than ends at which the air vent 112 and the clamp 14 are disposed, and is configured to support the mobile phone and prevent the mobile phone from falling down when the charging panel 11 is in a tilted state when charging the mobile phone.

Figure 3:
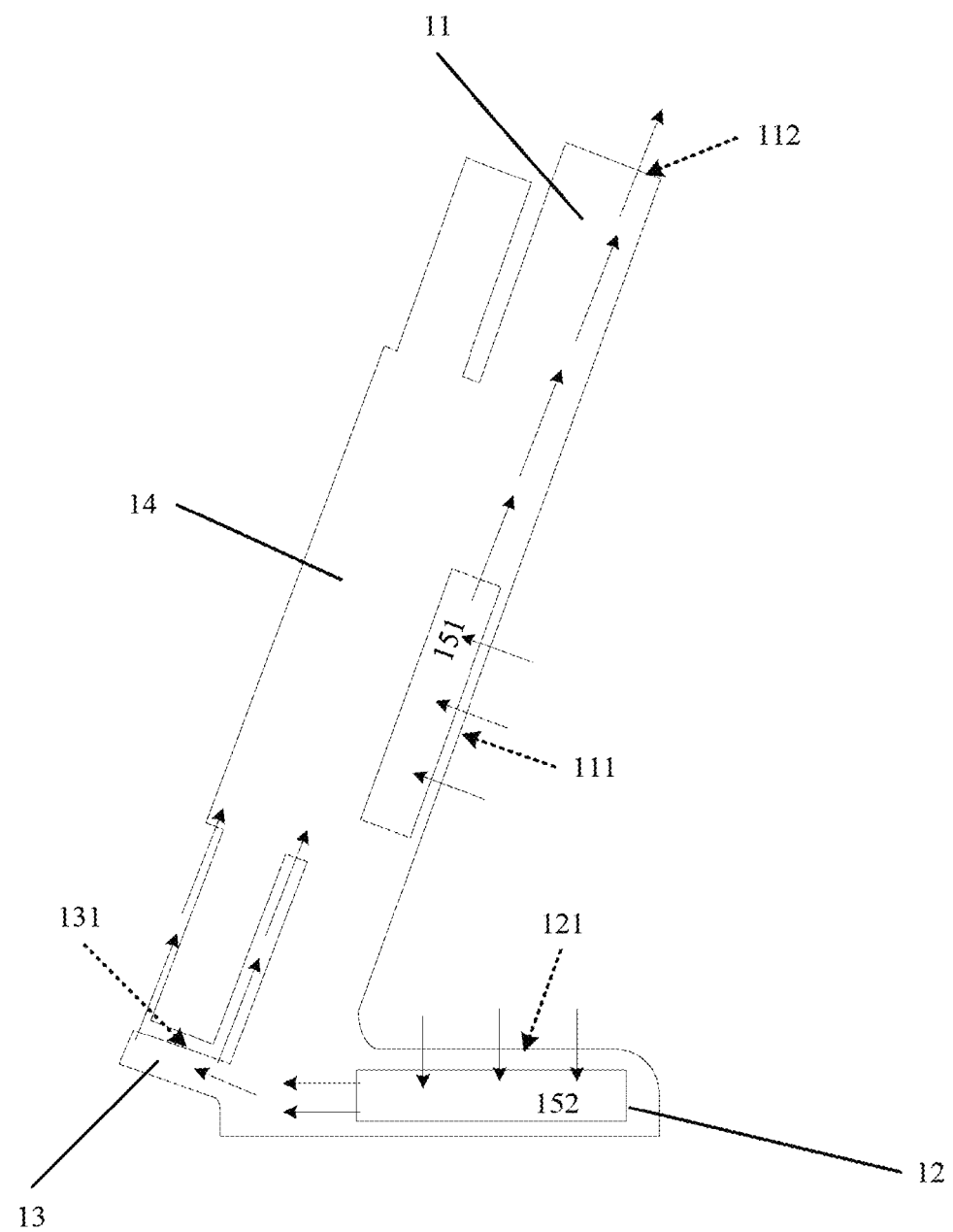
FIG. 3 is a schematic diagram of an air flow direction in a side view of a wireless charging base according to an embodiment of this application.
Figure 4:
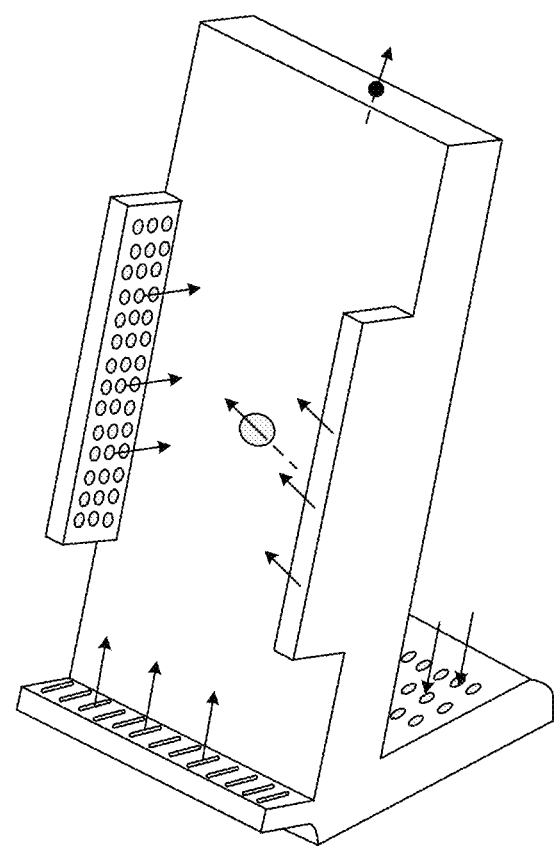
FIG. 4 is a schematic diagram of an air flow direction in a front view of a wireless charging base according to an embodiment of this application.

In this embodiment of this application, an air vent 131 is disposed on a surface that is of the base plate 13 and that is close to the clamp 14, and the inside of the base plate 13 is disposed as a hollow structure or an air duct (not shown in the figure) is disposed inside the base plate 13, so that after being directed to the hollow structure or the air duct, an air flow flows out from the air vent 131, as shown by the directions of the arrows shown in FIG. 3 and FIG. 4, to cool the mobile phone that is being charged.

A shape of the air vent 131 is not limited to a matrix shape formed by a plurality of circular holes shown in FIG. 1, and may be a matrix shape formed by a plurality of parallel rectangular holes, a matrix shape formed by a plurality of square holes, or the like. This is not limited in this embodiment of this application.

It should be specially noted that, for the case in which the inside of the base plate 13 in this application is disposed as a hollow structure or an air duct is disposed inside the base plate 13, the hollow structure or the air duct of the base plate 13 may be connected to the inside of the charging panel 11, so that after being directed to the hollow structure or the air duct of the base plate 13, an air flow blown out from the fan 151 flows out from the air vent 131; or may be connected to the inside of the subsequently described base plate 12. Details are subsequently described.

In a feasible embodiment, at least two protrusions are disposed on the surface that is of the base plate 13 and that is close to the clamp 14, and are configured to form, when the mobile phone is supported, an air duct between the mobile phone and the surface that is of the base plate 13 and that is close to the clamp 14, to avoid a temperature rise caused when the mobile phone and the surface of the base plate 13 are closely attached, and make, when the air vent 131 is disposed on the surface that is of the base plate 13 and that is close to the clamp 14, it convenient for air to flow out from the air vent 131, to cool the mobile phone that is being charged.

In addition, an angle formed between the base plate 13 and the charging panel 11 may be a right angle, or may be an angle less than 90 degrees. When the angle formed between the base plate 13 and the upper surface of the charging panel 11 is less than 90 degrees, the mobile phone is placed on the base plate 13, and a groove is formed at a joint between the surface that is of the base plate 13 and that is close to the clamp 14 and the upper surface of the charging panel 11, to avoid a temperature rise caused when the mobile phone and the surface of the base plate 13 are closely attached, and make, when the air vent 131 is disposed on the surface that is of the base plate 13 and that is close to the clamp 14, it convenient for air to flow out from the air vent 131, to cool the mobile phone that is being charged.

The base plate 12 is disposed on the lower surface of the charging panel 11, and is located at the same end as the base plate 13. The base plate 12 is at a specific angle of the charging panel 11, and is configured to support the charging panel 11 when the wireless charging base is placed on a desktop.

In this embodiment of this application, a fan 152 is disposed inside the base plate 12. The base plate 12 includes an air vent 121, and the air vent 121 is located on a surface that is of the base plate 12 and that is close to the lower surface of the charging panel 11. The base plate 12 may be disposed as a hollow structure or an air duct (not shown in the figure) may be disposed inside the base plate 12. The hollow structure or the air duct is connected to the hollow structure or the air duct of the base plate 13. After air enters the fan 152 from the air vent 121, an air flow is directed from the hollow structure or the air duct of the base plate 12 to the hollow structure or the air duct of the base plate 13, and then flows out from the air vent 131, as shown by directions of arrows shown in FIG. 4, to cool the mobile phone that is being charged.

The air vent 121 is most preferably located near the fan 152 on the surface that is of the base plate 12 and that is close to the lower surface of the charging panel 11, to better provide air for the fan 152. A shape of the air vent 121 may be a spiderweb-like shape, a matrix shape formed by a plurality of circular holes, or the like. This is not limited in this embodiment of this application.

In this embodiment of this application, a type, a model, and the like of the fan 152 are not limited, and may be the same as those of the fan 151. A suitable type and size are specifically selected as actually required. A quantity of fans 152 is not limited, either, and is selected as actually required.

In addition, an angle formed between the base plate 12 and the charging panel 11 needs to be less than 90 degrees. Most preferably, the angle is 45 degrees to 75 degrees. Certainly, a connection manner between the base plate 12 and the charging panel 11 is not limited to fastening shown in FIG. 1, and may be a rotatable connection. In this case, a user may rotate the base plate 12 to change the angle between the base plate 12 and the charging panel 11 as required, to obtain, through adjustment, a shape desired by the user.

Preferably, in this embodiment of this application, the air vent 121 is used as an air intake vent, and the air vent 131 is used as an air exhaust vent. After air enters the fan 151 inside the base plate 12 through the air vent 121, an air flow is formed and is directed from the hollow structure or the air duct of the base plate 12 to the hollow structure or the air duct of the base plate 13, and then flows out from the air vent 131.

According to the wireless charging base provided in this embodiment of this application, a fan is disposed inside the charging panel, to cool the charging panel 11 when the charging panel 11 operates and cool the electronic device that is being charged. A fan is disposed inside the base plate configured to support the charging panel, and an air flow formed in the fan flows out through an air vent on the base plate configured to support the electronic device that is being charged, to cool the electronic device that is being charged.

Figure 6:
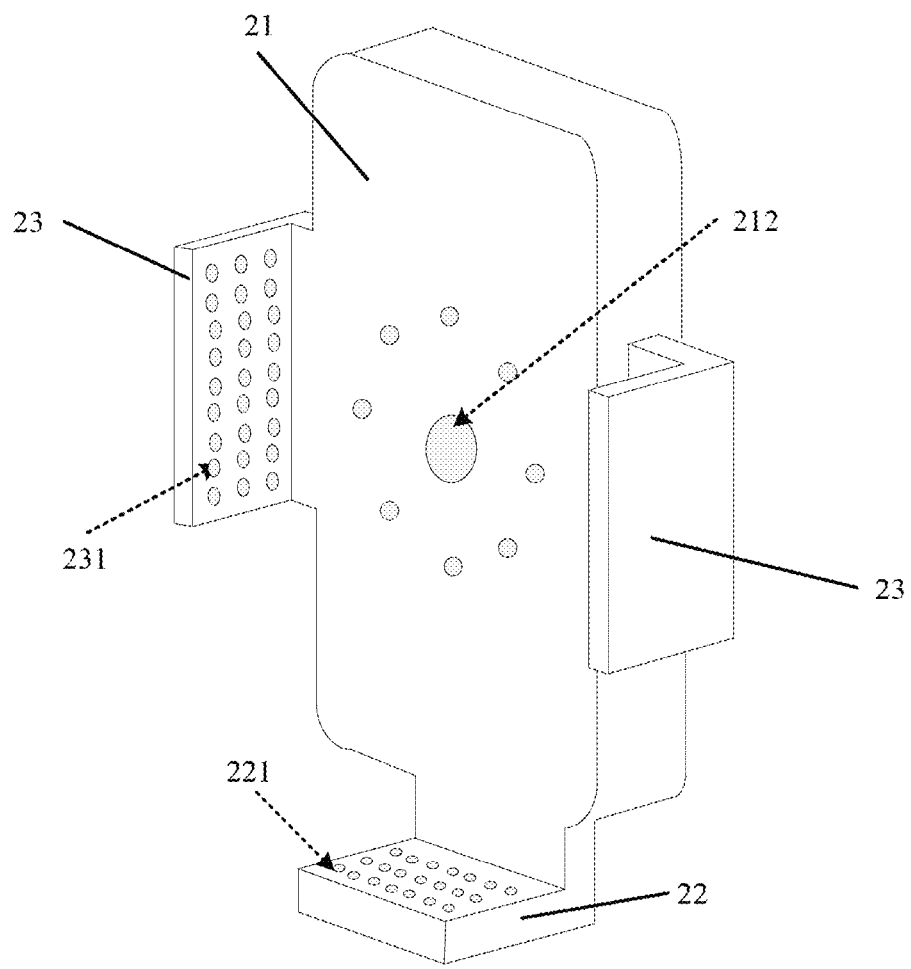
FIG. 6 is a schematic diagram of a front-view structure of a wireless charging base according to an embodiment of this application.
Figure 7:
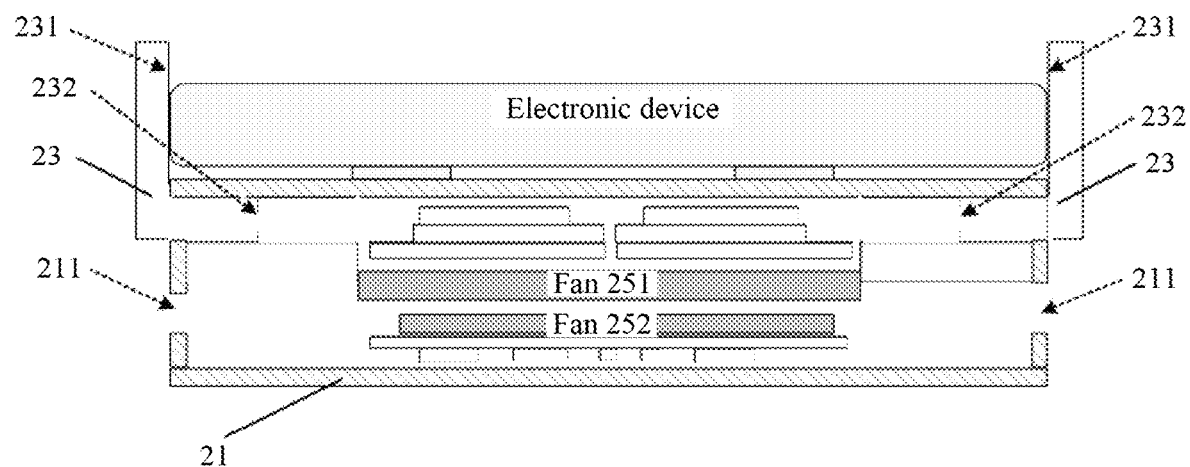
FIG. 7 is a schematic diagram of an internal cross-sectional structure of a wireless charging base according to an embodiment of this application.

FIG. 6 and FIG. 7 are schematic diagrams of structures of a wireless charging base according to an embodiment of this application.

As shown in the figure, the wireless charging base provided in this embodiment of this application includes a charging panel 21, a base plate 22, and two clamps 23. An application scenario of the wireless charging base is mostly applied to scenarios such as in-car wireless charging. In the wireless charging base, a coupling apparatus is disposed on a surface (for ease of subsequent description, the surface is referred to as a "lower surface", and a surface that is in contact with a mobile phone when the charging panel performs charging is referred to as an "upper surface") that is of the charging panel 21 and that is opposite to the surface in contact with the electronic device, and the wireless charging base is coupled to an object such as glass, a blade on an air exhaust vent of an air conditioner of a cab, or a wall surface by using the coupling apparatus.

In this embodiment of this application, a fan is disposed inside the charging panel 21. In this application, two fans are used as an example, and the two fans are a fan 251 and a fan 251. The charging panel 21 includes at least two air vents: an air vent 211 (in this embodiment of this application, the air vent 211 is disposed behind the clamp, and therefore the air vent cannot be seen from FIG. 6) that is located on a side surface around the charging panel 21 and an air vent (for ease of subsequent description, the air vent is defined as a "virtual air vent") coupled to the base plate 22 and the clamp 23. A shape of the air vent 211 may be a circular hole that has a relatively large radius, or may be a spiderweb-like shape, a matrix shape formed by a plurality of circular holes, or the like. This is not limited in this embodiment of this application, either. A shape of the virtual air vent needs to be determined based on shapes of the base plate 22 and the clamp 23.

When the fan 251 and the fan 252 operate, one of the air vent 211 and the virtual air vent provides air for the fan 251 and the fan 252 as an air intake vent, and the other air vent in the air vent 211 and the virtual air vent exhausts air for the fan 251 and the fan 252 as an air exhaust vent. Because an internal temperature of the charging panel 21 becomes increasingly higher when the charging panel 21 charges the mobile phone, in this application, the fan 251 and the fan 252 are disposed inside the charging panel 21, to cool the charging panel 21 when the charging panel 21 operates.

Preferably, in this embodiment of this application, the air vent 211 is used as an air intake vent, and the virtual air vent is used as an air exhaust vent. After air enters the fan 251 and the fan 252 inside the charging panel 21 through the air vent 211, an air flow is formed and flows out from the virtual air vent, as shown by directions of arrows shown in FIG. 8 and FIG. 9.

In this embodiment of this application, as shown in FIG. 7, the fan 251 and the fan 252 are stacked. After air enters the inside of the charging panel 21, an air flow is formed after the air passes through the fan 251, and then is directed to the fan 252. The air flow is further expanded by the fan 252 and flows out from the air exhaust vent. Certainly, an arrangement manner between the fan 251 and the fan 252 is not limited to the foregoing stacking manner, and the fan 251 and the fan 252 may be arranged in parallel or crossed. This is not limited in this application.

Types, models, and the like of the fan 251 and the fan 252 are not limited. A size of the fan 151 needs to be small, so that the fan 151 is installed inside the charging panel 11, without increasing an overall volume of the wireless charging base.

In addition, although two fans are used in this embodiment of this application, if a volume of the wireless charging base cannot accommodate two fans, one fan may be disposed in the charging panel 21 in this application, or three, four, or another quantity of fans may be disposed in the charging panel 21 as actually required. This is not limited in this embodiment of this application, either.

In a feasible embodiment, an air vent 212 is disposed on the upper surface of the charging panel 21. The air vent 212 is most preferably located near the fan 252 on the upper surface of the charging panel 21, so that an air flow blown out when the fan 252 operates better flows out from the air vent 212, to cool the mobile phone that is being charged. A shape of the air vent 212 may be a circular hole that has a relatively large radius and that is shown in FIG. 6, or may be a spiderweb-like shape, a matrix shape formed by a plurality of circular holes, or the like. This is not limited in this embodiment of this application, either.

Figure 8:
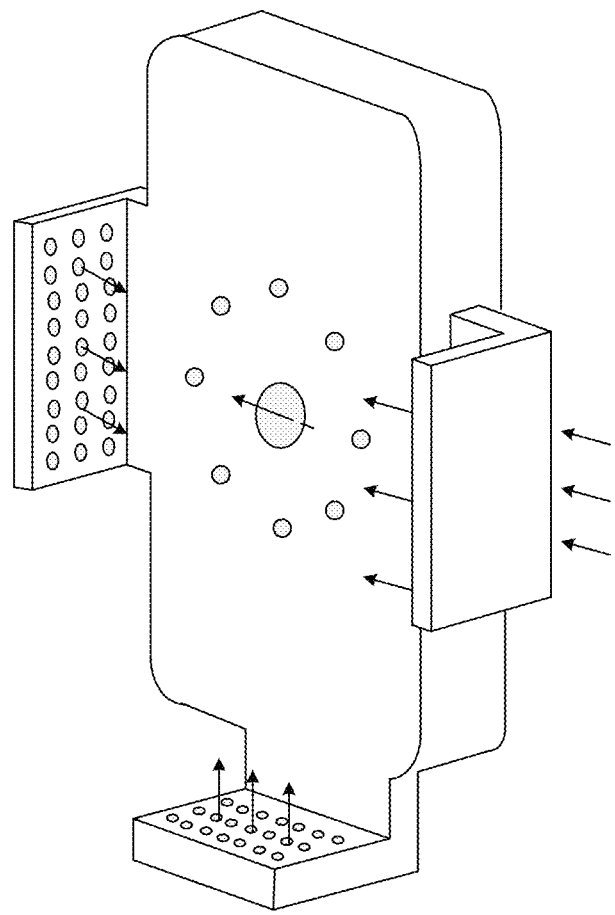
FIG. 8 is a schematic diagram of an air flow direction in a front view of a wireless charging base according to an embodiment of this application.
Figure 9:
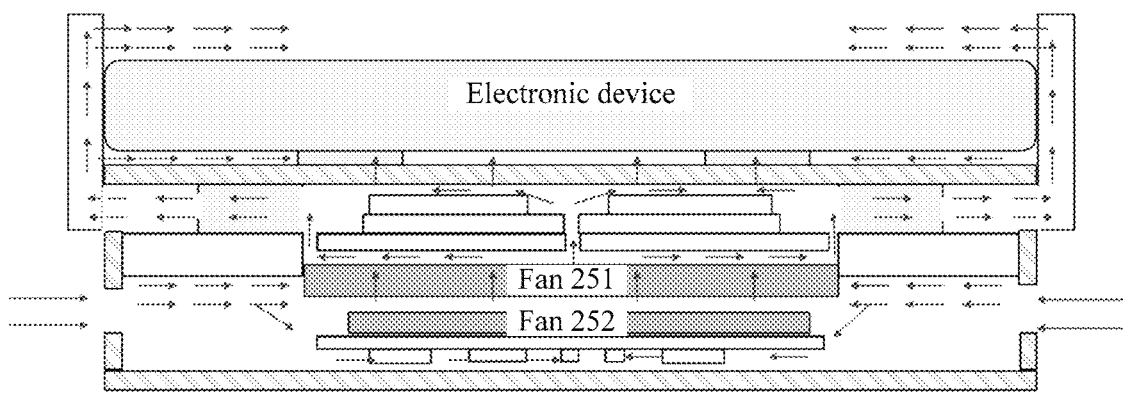
FIG. 9 is a schematic diagram of an air flow direction in an internal cross section of a wireless charging base according to an embodiment of this application.

In a feasible embodiment, at least two protrusions are disposed at a center position of the upper surface of the charging panel 21, and are configured to form an air duct between the mobile phone and the upper surface of the charging panel 21 when the mobile phone is close to the charging panel 21 and being charged, to avoid a temperature rise caused when the mobile phone and the upper surface of the charging panel 21 are closely attached, and make, when the air vent 212 is disposed on the upper surface of the charging panel 21, it convenient for an air flow to flow out from the air vent 212, as shown by the directions of the arrows shown in FIG. 8 and FIG. 9, to cool the mobile phone that is being charged. A shape formed by the plurality of protrusions is not limited to a circle, and may be any pattern such as a rectangle or a star. This is not limited in this embodiment of this application, either.

The two clamps 23 are separately disposed on side surfaces around the charging panel 21, so that the charging panel 21 is located between the two clamps 23, and the two clamps 23 are configured to fasten, to the charging panel 21, the mobile phone on which wireless charging is being performed. In this embodiment of this application, a shape of the clamp 23 is like "L" (herein, for ease of subsequent description, a part that is embedded into the inside of the charging panel 21 and that is parallel to the charging panel 23 is referred to as a third structure, and a part that is located on two sides of the charging panel 21 and that is perpendicular to the charging panel 21 is referred to as a fourth structure).

The third structure is embedded into the virtual air vent of the charging panel 21, and the fourth structure is located on two sides of the charging panel 21. An air vent 232 is disposed on a side surface at an end opposite to an end that is of the third structure and that is connected to the fourth structure. Air vents 231 are disposed on opposite surfaces of two fourth structures. The inside of the third structure and the fourth structure is disposed as a hollow structure or an air duct (not shown in the figure) is disposed inside the third structure and the fourth structure, so that after being directed to the hollow structure or the air duct from the air vent 232, air flows blown out by the fan 251 and the fan 252 flow out through the air vents 231, to cool the mobile phone that is being charged, as shown by the directions of the arrows shown in FIG. 8 and FIG. 9.

When a shape of an electronic device that needs to be charged is relatively large and exceeds a width of the charging panel 21, the clamps 23 on two sides of the charging panel 21 need to be pulled away from each other, so that third structures of the two clamps 23 are constantly withdrawn from the charging panel 21, and a distance between the two fourth structures is constantly increased. When the distance between the two fourth structures reaches a width of the electronic device that needs to be charged, the electronic device is placed on the charging panel 21 and between the two fourth structures, so that the to-be-charged electronic device is fastened.

Preferably, the air vent 231 is used as an air exhaust vent. After air flows formed when air passes through the fan 251 and the fan 252 flow out from the air vents 231, air flows are formed on an upper surface and a lower surface of the mobile phone that is being charged, to cool the mobile phone that is being charged.

In a feasible embodiment, at least two protrusions are disposed on opposite surfaces of the two clamps 23, and are configured to form air ducts between the electronic device and the opposite surfaces of the two clamps 23 when the electronic device is fastened, to avoid a temperature rise caused when the electronic device and the surface of the clamp 23 are closely attached, and make, when the air vents 231 are disposed on the opposite surfaces of the two clamps 23, it convenient for air flows to flow out from the air vents 231, as shown by the directions of the arrows shown in FIG. 8 and FIG. 9, to cool the mobile phone that is being charged.

A shape of the air vent 231 is not limited to a matrix shape formed by a plurality of circular holes shown in FIG. 6, and may be a matrix shape formed by a plurality of parallel rectangular holes, a matrix shape formed by a plurality of square holes, or the like. This is not limited in this embodiment of this application.

It should be specially noted that the wireless charging base provided in this embodiment of this application may include no clamp 23. When the charging panel 21 is horizontally placed on a desktop or tilted on a desktop at a small angle, the mobile phone may be directly placed on the upper surface of the charging panel 21 without being fastened by using the clamp 23.

In addition, a fastening manner of the clamp 23 in this embodiment of this application is not limited to the foregoing solution, and the clamps 23 may be directly fastened to side surfaces of two sides of the charging panel 21, or may be fastened in another manner. This is not limited in this embodiment of this application.

The base plate 22 is disposed on a side surface around the charging panel 21 that is different from side surfaces of sides on which the clamps 23 are disposed, and is configured to support the electronic device and prevent the electronic device from falling down when the charging panel 21 is in a tilted state when charging the electronic device. In this embodiment of this application, a shape of the base plate 22 is like "L" (herein, for ease of subsequent description, a part that is embedded into the inside of the charging panel 21 and that is parallel to the charging panel 23 is referred to as a fifth structure, and a part that is located on two sides of the charging panel 21 and that is perpendicular to the charging panel 21 is referred to as a sixth structure).

The fifth structure is embedded into the virtual air vent of the charging panel 21, and the sixth structure is located on a side surface of a side of the charging panel 21 that is different from the sides on which the clamps 23 are disposed. An air vent that communicates with the charging panel 21 is disposed on a side surface at an end opposite to an end that is of the fifth structure and that is connected to the sixth structure. An air vent 221 is disposed on a surface that is of the sixth structure and that is close to the charging panel 21. The inside of the fifth structure and the sixth structure is disposed as a hollow structure or an air duct (not shown in the figure) is disposed inside the fifth structure and the sixth structure, so that after being directed to the hollow structure or the air duct from the air vent that communicates with the charging panel, air flows blown out by the fan 251 and the fan 252 flow out through the air vent 221, as shown by the directions of the arrows shown in FIG. 8 and FIG. 9, to cool the mobile phone that is being charged.

When a shape of an electronic device that needs to be charged is relatively large and is far beyond a length of the charging panel 21, the base plate 22 at an end of the charging panel 21 needs to be pulled away from the charging panel 21, so that the fifth structure of the base plate 22 is constantly withdrawn from the charging panel 21, and a distance between the sixth structure and the charging panel 21 is constantly increased. When the distance between the sixth structure and the charging panel 21 reaches a length that does not cause the electronic device to fall backward when charging needs to be performed, the electronic device is placed on the charging panel 21 and between the two clamps 23 and the base plate 22, so that the to-be-charged electronic device is fastened.

Preferably, the air vent 221 is used as an air exhaust vent. After air flows formed when air passes through the fan 251 and the fan 252 flow out from the air vent 221, air flows are formed on an upper surface and a lower surface of the mobile phone that is being charged, to cool the mobile phone that is being charged.

In a feasible embodiment, at least two protrusions are disposed on a surface that is of the base plate 22 and that is close to the charging panel 21, and are configured to form an air duct between the electronic device and the base plate 22 when the electronic device is supported, to avoid a temperature rise caused when the electronic device and the surface of the base plate 22 are closely attached, and make, when the air vent 221 is disposed on the surface that is of the base plate 22 and that is close to the charging panel 11, it convenient for an air flow to flow out from the air vent 221, to cool the mobile phone that is being charged.

A shape of the air vent 221 is not limited to a matrix shape formed by a plurality of circular holes shown in FIG. 6, and may be a matrix shape formed by a plurality of parallel rectangular holes, a matrix shape formed by a plurality of square holes, or the like. This is not limited in this embodiment of this application.

In addition, a fastening manner of the base plate 22 in this embodiment of this application is not limited to the foregoing solution, and the base plate 22 may be directly fastened to a side surface of an end of the charging panel 21, or may be fastened in another manner. This is not limited in this embodiment of this application.

According to the wireless charging base provided in this embodiment of this application, the wireless charging base is mostly applied to an in-car charging scenario. Two fans are disposed inside the charging panel in the wireless charging base, to cool the charging panel 11 when the charging panel 11 operates and cool the electronic device that is being charged.

In the descriptions of this specification, the described specific features, structures, materials, or characteristics may be combined in a proper manner in any one or more of the embodiments or examples.

Finally, it should be noted that the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. A wireless charging base comprising a charging panel, a first base plate, a second base plate, a first clamp a second clamp, at least one first fan and at least one second fan, wherein the charging panel is configured to charge an electronic device, and the charging panel further comprises a first air vent and a second air vent;

when the electronic device is being charged, the first air vent is disposed on a lower surface of the charging panel, the lower surface is a surface opposite an upper surface of the charging panel that is in contact with the electronic device, and the second air vent is disposed on a side surface around the charging panel, wherein an air duct exists between the first and second air vents;

the first base plate is disposed on the upper surface of the charging panel, located at an end of the charging panel, and is configured to support the electronic device when the electronic device is being charged, and the first base plate comprises a third air vent disposed on a first surface of the first base plate, which is closest to the second air vent;

the second base plate is disposed on the lower surface of the charging panel, located at a same end as the first base plate, and is configured to support the charging panel, and the second base plate comprises a fourth air vent disposed on a first surface of the second base plate, which is proximate to the charging panel, wherein an air duct exists between the third and fourth air vents;

the first clamp and the second clamp are disposed on side edges of the side surface around the charging panel, wherein the first clamp comprises a fifth air vent and the second clamp comprises a sixth air vent, and wherein an air duct exists between the fifth air vent and both the first air vent and the second air vent, and an air duct exists between the sixth air vent and both the first air vent and the second air vent;

the at least one first fan is disposed inside the charging panel, and is configured to suck air into an inside of the charging panel from the first air vent and a formed air flow flows out from the second air vent, out from the fifth air vent, and out from the sixth air vent; and the at least one second fan is disposed inside the second base plate, and is configured to suck air into an inside of the first base plate and the second base plate from one of the third air vent and the fourth air vent, and a formed air flow flows out from another air vent of the third air vent and the fourth air vent.

2. The wireless charging base according to claim 1, wherein the charging panel further comprises a seventh air vent; and the seventh air vent is disposed on the upper surface of the charging panel, wherein an air duct exists between the seventh air vent and the first air vent and an air duct exists between the seventh air vent and the second air vent.

3. The wireless charging base according to claim 1, wherein at least two protrusions are disposed on the upper surface of the charging panel, and are configured to form an air duct between the electronic device and the upper surface of the charging panel when the electronic device is being charged.

4. The wireless charging base according to claim 1, wherein at least two protrusions are disposed on the first surface of the first base plate, and are configured to form an air duct between the electronic device and the first surface of the first base plate when the electronic device is being charged.

5. The wireless charging base according to claim 1, wherein an included angle between the first base plate and the charging panel is 90 degrees.

6. The wireless charging base according to claim 1, wherein the charging panel is located between the first clamp and the second clamp, wherein the first clamp is opposite to the second clamp, and the first clamp and the second clamp are configured to fasten the electronic device to the charging panel when the electronic device is being charged.

7. The wireless charging base according to claim 6, wherein at least two protrusions are disposed on each of opposite surfaces of the first clamp and the second clamp, and are configured to form air ducts between the electronic device and opposite surfaces of the first clamp and the second clamp when the electronic device is being charged.

* * * * *

UNITED STATES PATENT AND TRADEMARK OFFICE
CERTIFICATE OF CORRECTION

| | | |
|---|---|---|
| PATENT NO. | : 11,991,854 B2 | Page 1 of 1 |
| APPLICATION NO. | : 17/704996 | |
| DATED | : May 21, 2024 | |
| INVENTOR(S) | : Wu et al. | |

It is certified that error appears in the above-identified patent and that said Letters Patent is hereby corrected as shown below:

In the Claims

Claim 1, Column 15, Line 6: "a first base plate, a second base plate, a first clamp a second" should read -- a first base plate, a second base plate, a first clamp, a second --.

Claim 1, Column 16, Line 2: "fifth air vent, and out from the sixth air vent; and" should read -- fifth air vent out, and from the sixth air vent; and --.

Signed and Sealed this
Eighth Day of April, 2025

Coke Morgan Stewart
*Acting Director of the United States Patent and Trademark Office*